United States Patent
Naruse

(10) Patent No.: US 10,308,250 B2
(45) Date of Patent: Jun. 4, 2019

(54) DIGITAL FILTER AND VEHICLE DRIVING FORCE CONTROL APPARATUS

(71) Applicant: TOYOTA JIDOSHA KABUSHIKI KAISHA, Toyota-shi, Aichi (JP)

(72) Inventor: Tomohiro Naruse, Toyokawa (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 112 days.

(21) Appl. No.: 15/229,742

(22) Filed: Aug. 5, 2016

(65) Prior Publication Data
US 2017/0057509 A1    Mar. 2, 2017

(30) Foreign Application Priority Data

Aug. 26, 2015 (JP) ................................. 2015-166806

(51) Int. Cl.
| | | |
|---|---|---|
| *B60W 30/18* | (2012.01) | |
| *B60W 10/06* | (2006.01) | |
| *B60W 10/08* | (2006.01) | |
| *B60W 20/00* | (2016.01) | |

(Continued)

(52) U.S. Cl.
CPC ............... *B60W 30/18* (2013.01); *B60K 6/44* (2013.01); *B60W 10/04* (2013.01); *B60W 10/06* (2013.01); *B60W 10/08* (2013.01); *B60W 10/10* (2013.01); *B60W 20/00* (2013.01); *B60W 20/15* (2016.01); *B60W 50/06* (2013.01); *H03H 17/0201* (2013.01); *H03H 17/025* (2013.01); *H03H 17/0291* (2013.01); *H03H 21/0021* (2013.01);

(Continued)

(58) Field of Classification Search
CPC ............. H03H 17/0201; H03H 17/021; H03H 17/025; H03H 17/0283; H03H 17/0291; H03H 17/0294; H03H 17/0416; H03H 17/0621; H03H 21/0012; H03H 21/0016; H03H 21/002; H03H 21/0021; H03H 2021/0096; H03H 2021/0098; H03H 17/21; H03H 17/0012; H03H 17/0016; H03H 17/002; H03H 17/0021
USPC ........ 375/229, 232, 285, 346, 350; 708/300, 708/303, 309, 322, 323
See application file for complete search history.

(56) References Cited

U.S. PATENT DOCUMENTS

| | | | |
|---|---|---|---|
| 2007/0291178 A1* | 12/2007 | Chao | ........................ H04N 5/21 348/607 |
| 2013/0144130 A1* | 6/2013 | Russell | ................ A61B 5/0205 600/301 |

(Continued)

FOREIGN PATENT DOCUMENTS

| | | |
|---|---|---|
| JP | 2007-237879 A | 9/2007 |
| JP | 2007-237881 A | 9/2007 |

(Continued)

*Primary Examiner* — Young T Tse
(74) *Attorney, Agent, or Firm* — Oliff PLC

(57) ABSTRACT

To suppress an unstable operation of a device caused by filtering, an output selection unit is configured to acquire an unfiltered value representing an input signal (signal before filtering) stored in an input holding unit, a filtered value representing a signal acquired by filtering the input signal by a filtering unit, and a previous output value representing an output signal output at a previous time, select a middle value out of the filtered value, the unfiltered value, and the previous output value, and set the selected middle value as a current output value of an output signal.

12 Claims, 10 Drawing Sheets

(51) Int. Cl.
*H03H 17/02* (2006.01)
*H03H 21/00* (2006.01)
*B60K 6/44* (2007.10)
*B60W 10/04* (2006.01)
*B60W 10/10* (2012.01)
*B60W 50/06* (2006.01)
*B60W 20/15* (2016.01)
*B60W 20/10* (2016.01)
*B60W 50/00* (2006.01)

(52) U.S. Cl.
CPC ..... *B60W 20/10* (2013.01); *B60W 2050/0052* (2013.01); *B60W 2510/22* (2013.01); *B60W 2520/10* (2013.01); *B60W 2520/16* (2013.01); *B60W 2520/18* (2013.01); *B60W 2540/10* (2013.01); *B60W 2710/06* (2013.01); *B60W 2710/0666* (2013.01); *B60W 2710/083* (2013.01); *Y02T 10/6286* (2013.01)

(56) References Cited

U.S. PATENT DOCUMENTS

| | | | |
|---|---|---|---|
| 2013/0226380 A1 | 8/2013 | Ando et al. | |
| 2013/0253859 A1* | 9/2013 | Freeman | G05B 23/0205 702/58 |
| 2015/0026165 A1* | 1/2015 | Louie | G06F 17/30699 707/723 |
| 2015/0146769 A1* | 5/2015 | Omer | H04L 25/03159 375/232 |
| 2015/0151746 A1 | 6/2015 | Saito | |

FOREIGN PATENT DOCUMENTS

| | | | | |
|---|---|---|---|---|
| JP | 2013-177026 A | 9/2013 | | |
| JP | 2015-105042 A | 6/2015 | | |
| JP | 2015-105621 A | 6/2015 | | |
| WO | WO-2013013287 A1 * | 1/2013 | ........... | H04L 7/0025 |

\* cited by examiner

DIGITAL FILTER AND VEHICLE DRIVING FORCE CONTROL APPARATUS

BACKGROUND OF THE INVENTION

1. Field of the Invention

The present invention relates to a digital filter and a vehicle driving force control apparatus configured to reduce a vehicle body vibration through use of the digital filter.

2. Description of the Related Art

Hitherto, there is known a technology of controlling a driving force of a driving device, e.g., an engine, to thereby reduce a vehicle body vibration. For example, in order to reduce the vehicle body vibration, an apparatus proposed in Japanese Patent Application Laid-Open No. 2007-237879 is configured to use a notch filter to filter a signal representing a driver required driving force, and control a driving force of a driving device based on the driver required driving force after the filtering. In this apparatus, a notch frequency of the notch filter is set to a value for reducing a frequency component of a pitching vibration of the vehicle body. As a result, the pitching vibration of the vehicle body can be reduced. As such a notch filter, a digital filter is used.

An output signal value after a specific frequency component is removed by the digital filter in this way can be used to control various devices. However, the output signal value after the filtering by the digital filter has such a characteristic as to be delayed from an input signal value before the filtering, and not to monotonically follow a change in the input signal value (that is, to pulsate).

Therefore, when an operation of a device is controlled based on the output signal value, the operation of the device may become unstable. Moreover, a fluctuation range of the output signal value may exceed a fluctuation range of the input signal value, that is, the output signal value may overshoot or undershoot with respect to the input signal value.

For example, a case is considered in which a control system for a device is constructed to start an operation of the device when the output signal value of the digital filter becomes more than a first threshold value, and to stop the operation of the device when the output signal value becomes less than a second threshold value (<first threshold value). On this occasion, a range of from the second threshold value to the first threshold value is a dead zone for preventing hunting.

When the input signal value input to the digital filter increases to become more than the first threshold value, the output signal value increases accordingly to become more than the first threshold value. Then, even when the input signal value is maintained to be a value larger than the first threshold value, the output signal value after the filtering may temporarily increase/decrease to become less than the second threshold value. In this case, the device that needs to be maintained in operating condition temporarily stops.

A description is now given of the problem in one example. For example, a case is considered in which, in a hybrid vehicle in which a hybrid system constructed by combining an engine and a motor/generator is used to generate a driving force, the driving force is controlled by using an output signal value of a notch filter (digital filter) to decrease a pitching vibration of a vehicle body. In this hybrid vehicle, a signal representing the driver required driving force determined by an accelerator operation amount and a vehicle speed is input to the notch filter, and an output signal value of the notch filter is used to control the driving force of the hybrid system. In this apparatus, a notch frequency of the notch filter is set to a value for reducing a frequency component of the pitching vibration of the vehicle body. Thus, the pitching vibration of the vehicle body can be suppressed.

In the hybrid vehicle, operations of the engine and the motor/generator are switched depending on the value of the driver required driving force. For example, such a control system is considered that when the driver required driving force value is equal to or less than a first threshold value, the driving force is generated only by the motor/generator, and when the driver required driving force value becomes more than the first threshold value, the engine is started. In this case, a threshold value for stopping the engine in order to prevent hunting is set to a second threshold value less than the first threshold value.

When an accelerator pedal is suddenly depressed under a state in which the accelerator pedal is released (under a regenerative braking state by the motor), as shown in FIG. 10, a driver required driving force value Fin before the filtering rapidly increases, and is then stabilized. In this example, the driver required driving force value Fin becomes more than a first threshold value ref1 in the course of the increase. On the other hand, a driver required driving force value Fout after the filtering transitions so as to follow the driver required driving force value Fin to increase halfway, but in the vicinity after the first threshold value ref1, turn to decrease to become less than the second threshold value ref2, and then turn to increase to approach the driver required driving force value Fin. Thus, the control state of the engine switches alternately in such a sequence as stop→start→stop→start. In other words, each time the driver required driving force value Fout passes across the dead zone, the control of the engine presents hunting. When this phenomenon occurs, the driver may feel a sense of discomfort.

Moreover, for example, as shown in FIG. 11, the driver required driving force value Fout after the filtering may temporarily become much more than the driver required driving force value Fin before the filtering. FIG. 11 is a graph for showing a state in which the driver is depressing the accelerator pedal, then suddenly releases the accelerator pedal, and then soon depresses the accelerator pedal again. In this case, there is such a fear that the driver may feel an unintended sense of acceleration.

The digital filter is used for various control apparatuses as well as for damping control for the vehicle body. However, as described above, there is such a fear that the operation of the device may become unstable when a device is controlled based on the output signal value of the digital filter.

SUMMARY OF THE INVENTION

The present invention has been made in view of the above-mentioned problem, and has an object to suppress instability of an operation of a device caused by filtering.

In order to achieve the above-mentioned object, a digital filter of one embodiment of the present invention resides in a digital filter, which is configured to output an output signal acquired by reducing a specific frequency component from a digital signal input to the digital filter, and which is to be used for a system in which an operation of a device is controlled depending on an output value of the output signal, the digital filter including:

filtering means for applying filtering to the input digital signal; and output value setting means for acquiring an unfiltered value represented by a signal before the filtering input to the filtering means, a filtered value represented by a signal acquired by filtering the signal before the filtering by the filtering means, and a previous output value represented by the output signal output at a previous time, selecting a middle value out of the unfiltered value, the filtered value, and the previous output value, and setting a current output value of the output signal based on the selected middle value.

The digital filter according to the one embodiment of the present invention is configured to output the output signal acquired by reducing the specific frequency component from the digital signal input to the digital filter. This digital filter is to be used for the system in which the operation of the device is controlled depending on the output value of the output signal of the digital filter. For example, if the digital filter is used for a system in which an operation of a device is controlled depending on a magnitude relationship between the output value and a threshold value, when the output signal value of the digital filter fluctuates to increase/decrease with respect to the input signal value, the output signal value may pass across the threshold value undesirably, resulting in instability of the operation of the device. In this case, even if a dead zone is provided for the threshold value, when the output signal value of the digital filter pulsates beyond the dead zone, this problem is not solved. Thus, the digital filter according to the one embodiment of the present invention includes the output value setting means.

The filtering means is configured to apply the filtering to the input digital signal. The output value setting means is configured to acquire the unfiltered value represented by the signal before the filtering input to the filtering means, the filtered value represented by the signal acquired by filtering the signal before the filtering by the filtering means, and the previous output value represented by the output signal output at the previous time, select the middle value out of the unfiltered value, the filtered value, and the previous output value, and set the current output value of the output signal based on the selected middle value.

For example, when the filtered value is departing from the unfiltered value, the previous output value is selected as the middle value after a time point of the departure. Then, while the magnitude relationship between the previous output value and the filtered value remains the same, the middle value is maintained to be the previous output value, and is thus a constant value.

When, for example, the filtered value changes toward a direction of approaching the unfiltered value under this state, and the magnitude relationship between the filtered value and the previous output value is inverted, the filtered value is selected as the middle value. Thus, the middle value follows the filtered value, and approaches the unfiltered value. Conversely, when the unfiltered value changes, and the magnitude relationship between the unfiltered value and the previous output value is inverted, the unfiltered value is selected as the middle value. As a result, the middle value follows the unfiltered value.

The output value of the output signal is set based on the middle value. Thus, the output value can be caused to approach the unfiltered value while the fluctuation of the output value is suppressed. As a result, the output value can be prevented from passing across the threshold value undesirably. Moreover, a fluctuation range of the output value can be prevented from exceeding a fluctuation range of the unfiltered value.

Thus, the digital filter according to the one embodiment of the present invention can stably control a device. Moreover, the stable control can be carried out by using the simple configuration of providing the output value setting means without changing a characteristic of the filtering means.

A feature of the digital filter according to one aspect of the present invention resides in that the output value setting means is configured to set the selected middle value as the current output value of the output signal. As a result, the output value is reliably guarded so as not to depart from the unfiltered value by setting the middle value as the output value, and the output value can thus be caused to monotonically approach the unfiltered value. Thus, a device can stably be controlled by the simple processing.

A feature of the digital filter according to one aspect of the present invention resides in that the output value setting means is configured to:

carry out, when the selected middle value is the previous output value, at least one of increase correction processing (S15) of increasing the selected middle value by a predetermined amount for correction and setting the value corrected to increase as the output value when the filtered value is more than the unfiltered value, or decrease correction processing (S14) of decreasing the selected middle value by a predetermined amount for correction and setting the value corrected to decrease as the output value when the filtered value is less than the unfiltered value; and set (S12) the selected middle value as the current output value of the output signal when the selected middle value is not the previous output value.

When the middle value itself is set as the output value, the output value does not change while the previous output value is the middle value. Thus, the output value is very stable, and is thus advantageous for stability of the device. On the other hand, when the transition of the output value needs to approach the original operation of the filtering, the one aspect of the present invention is effective.

In the one aspect of the present invention, the output value setting means is configured to carry out, when the selected middle value is the previous output value, at least one of the increase correction processing of increasing the selected middle value by the predetermined amount for correction and setting the value corrected to increase as the output value when the filtered value is more than the unfiltered value, or the decrease correction processing of decreasing the selected middle value by the predetermined amount for correction and setting the value corrected to decrease as the output value when the filtered value is less than the unfiltered value. Moreover, the output value setting means is configured to set the selected middle value as the current output value of the output signal when the selected middle value is not the previous output value.

Therefore, the output value can be caused to approach the original operation of the filtering by the simple processing. When the selected middle value is the previous output value, the digital filter preferably corrects the middle value while the output value is restricted to a range in which the output value does not pass across the threshold value.

The digital filter according to the one embodiment of the present invention can also be applied to a vehicle driving force control apparatus.

This vehicle driving force control apparatus resides in including:

required driving force calculation means for calculating a driver required driving force, and outputting a required driving force signal representing the calculated driver required driving force;

a notch filter constructed by the digital filter, and configured to input the required driving force signal, and to use the filtering means to apply the filtering to the required driving force signal so as to reduce a vibration frequency component of a vehicle body; and driving force control means for controlling a driving force to be generated in a vehicle travel driving device based on an output value of an output signal of the notch filter.

In the vehicle driving force control apparatus according to the one embodiment of the present invention, the required driving force calculation means is configured to calculate the driver required driving force, and to output the required driving force signal representing the calculated driver required driving force to the notch filter. The notch filter is configured to input the required driving force signal, and to use the filtering means to apply the filtering to the required driving force signal so as to reduce the vibration frequency component of the vehicle body. The driving force control means is configured to control the driving force to be generated in the vehicle travel driving device based on the output value of the output signal of the notch filter. Thus, the vibration of the vehicle body can be suppressed. Moreover, the undesired fluctuation of the state of the vehicle travel driving device is suppressed. Further, the driving force can be prevented from being excessive. As a result, the driver can be prevented from feeling the sense of discomfort.

A feature of the vehicle driving force control apparatus according to one aspect of the present invention resides in that:

the vehicle travel driving apparatus is a hybrid driving apparatus including an engine and a motor/generator; and the driving force control means is configured to control a driving force of the hybrid driving apparatus depending on the output value of the output signal of the notch filter, and to switch between a driving state and a non-driving state of the engine.

As a result, the drive state and the non-drive state of the engine can be stably switched in the hybrid vehicle.

A feature of the vehicle driving force control apparatus according to one aspect of the present invention resides in that:

the vehicle travel driving apparatus is a driving apparatus including an engine and an automatic transmission; and the driving force control means is configured to control a driving force of the engine and shift a gear position of the automatic transmission depending on the output value of the output signal of the notch filter.

As a result, the gear ratio (gear position) of the automatic transmission can be stably shifted.

In the above description, a reference numeral used in an embodiment of the present invention is enclosed in parentheses and is assigned to each of the constituent features of the invention corresponding to the embodiment in order to facilitate understanding of the invention. However, each of the constituent features of the invention is not limited to the embodiment defined by the reference numeral.

DETAILED DESCRIPTION OF THE PREFERRED EMBODIMENTS

Figure 1:
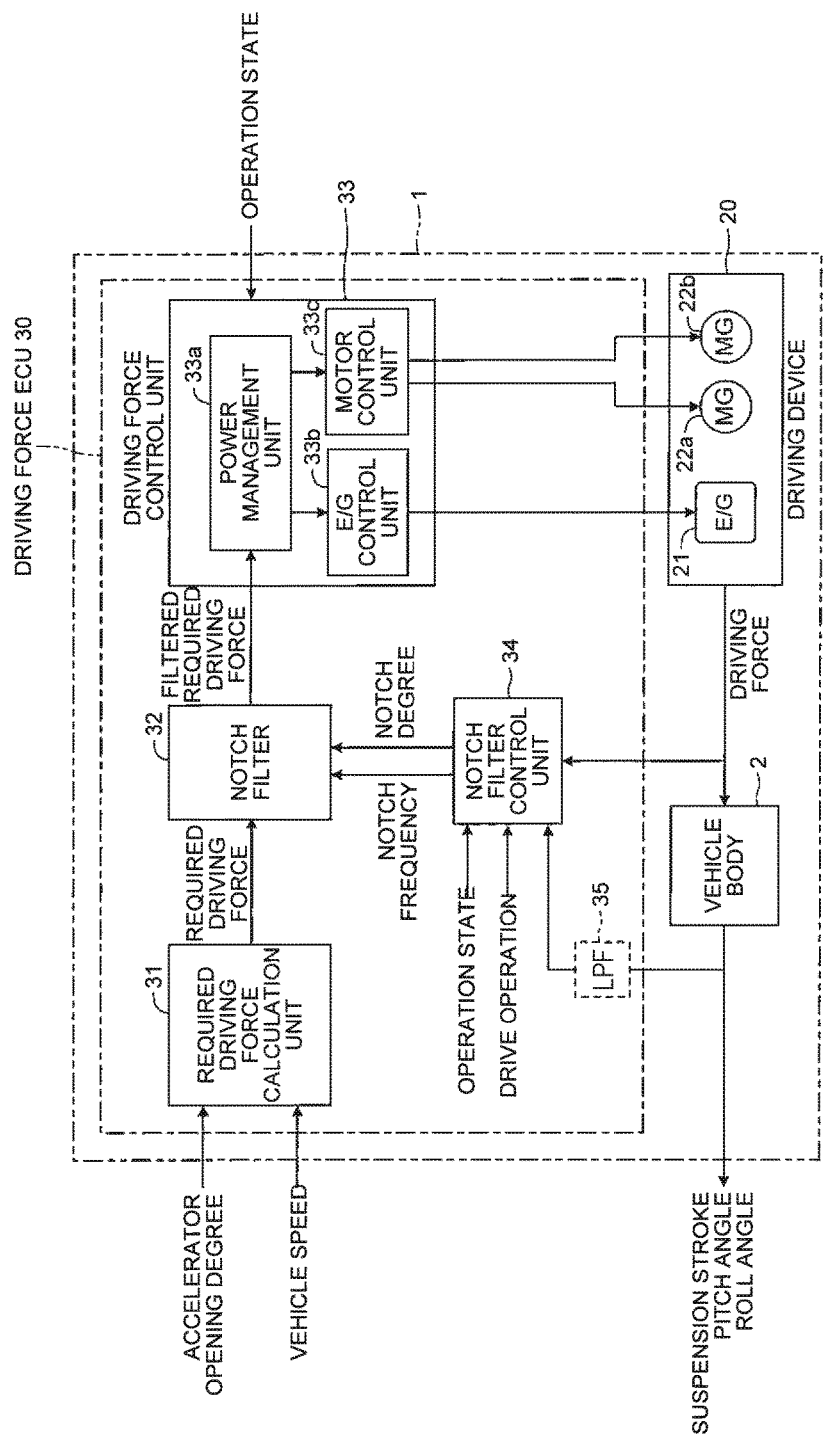
FIG. 1 is a schematic configuration diagram for illustrating a vehicle driving force control apparatus according to a first embodiment of the present invention.

A detailed description is now given of embodiments of the present invention referring to the drawings. FIG. 1 is a schematic configuration diagram for illustrating a vehicle driving force control apparatus according to a first embodiment of the present invention.

A vehicle 1 includes a driving device 20 configured to apply a driving force to wheels and a driving force ECU 30 configured to control the driving force of the driving device 20. The vehicle 1 of this embodiment is a hybrid vehicle. The driving device 20 is a hybrid system including an engine 21 and two motor/generators 22a and 22b. "ECU" is an abbreviation of "electronic control unit".

The driving force ECU 30 includes a required driving force calculation unit 31 configured to calculate a driver required driving force, a notch filter 32 constructed by a digital filter, a driving force control unit 33 configured to control the driving force, and a notch filter control unit 34. The driving force ECU 30 includes a microcomputer as a principal component. The microcomputer includes a CPU and storage devices such as a ROM and a RAM. The driving force ECU 30 corresponds to a vehicle driving force control apparatus according to the present invention.

The required driving force calculation unit 31 is configured to input signals representing an accelerator opening degree, which is a driving operation amount of a driver, and a vehicle speed, and calculate a driver required driving force (hereinafter referred to as required driving force) based on the accelerator opening degree and the vehicle speed. For example, the required driving force is calculated based on a required driving force map (not shown), and is set to a value that increases as the accelerator opening degree increases, and decreases as the vehicle speed increases.

A signal (digital signal) representing the required driving force is input to the notch filter 32. The notch filter 32, which is a digital filter, is configured to suppress or block transmission of a notch frequency component among frequency components included in the signal representing the required driving force, to thereby reduce the notch frequency component. In this case, the notch frequency is basically set to a resonance frequency of a vehicle body. A signal (digital signal) representing a filtered required driving force (command driving force) after the filtering by the notch filter 32 is input to the driving force control unit 33.

The driving force control unit 33 includes a power management unit 33a, an engine control unit 33b, and a motor control unit 33c. The power management unit 33a is configured to calculate an engine required output and motor required torques respectively for the two motor/generators 22a and 22b based on a command driving force and operation states (such as a state of charge of a battery, and rotational speeds of the engine 21 and the motor/generators 22a and 22b). The power management unit 33a is configured to provide an instruction for the engine required output to the engine control unit 33b, and an instruction for the motor required torques to the motor control unit 33c.

The engine control unit 33b is configured to control the engine 21 for driving in accordance with the engine required output. For example, the engine control unit 33b is configured to carry out fuel injection control, ignition control, and intake air amount control based on the engine required output. Moreover, the motor control unit 33c is configured to control current supply to an inverter (motor drive circuit) (not shown) in accordance with the motor required torques, thereby controlling the two motor/generators 22a and 22b for driving.

The configuration of the hybrid system and the calculation methods for the required values and the like are widely known, and are described in, for example, Japanese Patent Application Laid-open No. 2013-177026. In this embodiment, those widely-known technologies can be used.

In the hybrid system, the engine 21 is driven under such a condition that an operation efficiency (namely, fuel efficiency) of the engine is equal to or more than a permissible lower limit. Therefore, a lower limit of the engine required output is set as a start condition for the engine 21. The power management unit 33a is configured to start the engine 21 when the command driving value becomes more than a first threshold value ref1, and stop the engine 21 when the command driving value becomes less than a second threshold value ref2, based on a command driving force (filtered required driving force) supplied from the notch filter. A zone between the first threshold value ref1 and the second threshold value ref2 functions as a dead zone.

In this example, the command driving value, and the first threshold value ref1 and the second threshold value ref2 are compared with each other. However, in place of this configuration, for example, the engine required output calculated from the command driving value and a first reference value ref1' and a second reference value ref2' may be compared with each other, to start the engine 21 when the engine required output becomes more than the first reference value ref1', or to stop the engine 21 when the engine required output becomes less than second reference value ref2'. Both of the configurations are practically the same. Moreover, the first threshold value ref1 and the second threshold value ref2 may be variably set depending on the operation state.

In this way, the driving device 20 is driven, and the driving force is applied to the vehicle body 2 via the drive wheels. When the driving force fluctuates, the vehicle body 2 vibrates. In particular, vibrations of the vehicle body 2, such as a pitching vibration and a rolling vibration, appear as changes in a suspension stroke, a pitch angle, and a roll angle.

Figure 2:
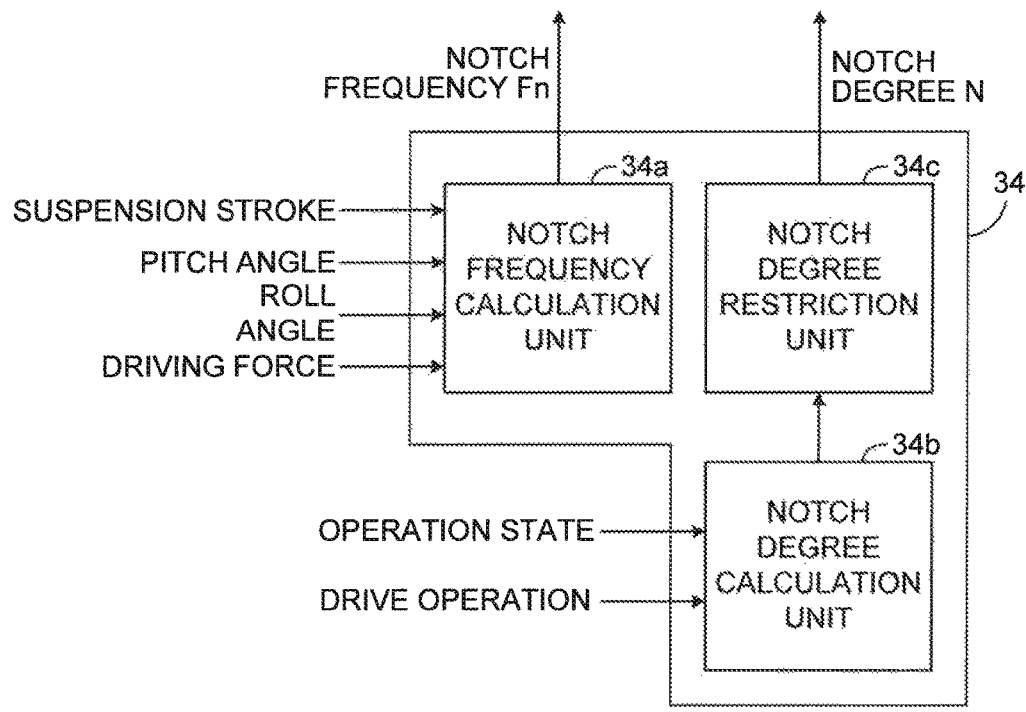
FIG. 2 is a configuration diagram for illustrating a notch filter control unit.

A signal representing the driving force, and signals representing the changes in the suspension stroke, the pitch angle, and the roll angle generated on the vehicle body 2 by the fluctuation of the driving force are input to the notch filter control unit 34. Signals representing an operation state of the vehicle and a drive operation of the driver are also input to the notch filter control unit 34. As illustrated in FIG. 2, the notch filter control unit 34 includes a notch frequency calculation unit 34a, a notch degree calculation unit 34b, and a notch degree restriction unit 34c.

The notch frequency calculation unit 34a variably controls a notch frequency of the notch filter 32. Specifically, the notch frequency calculation unit 34a calculates an amplitude distribution of pitching vibration or rolling vibration of the vehicle body 2 with respect to a frequency of the command driving force based on the corresponding relationship to vibration of the vehicle body 2, in particular, the pitching vibration or the rolling vibration. Then, the notch frequency calculation unit 34a controls (changes/sets) the notch frequency so as to maximally suppress amplitude of the pitching vibration or the rolling vibration of the vehicle body 2.

For example, the notch frequency calculation unit 34a performs frequency analysis by a Fourier transform method for response motion of the vehicle body 2 to a driving force applied to the vehicle body 2 in various driving states of the vehicle. Then, the notch frequency calculation unit 34a calculates an amplitude distribution of the pitching vibration or the rolling vibration of the vehicle body 2 with respect to the frequency of the command driving force, and controls the notch frequency so as to maximally suppress the amplitude thereof.

In this case, a signal representing the pitching or the rolling of the vehicle body 2, which is input to the notch filter control unit 34, may be subjected to low-pass filtering by a low-pass filter as indicated by a broken-line block 35 of FIG. 1. Through the low-pass filtering, vehicle body vibration of a relatively low frequency of from about 1 Hz to about 2 Hz, which is easily generated by resonance along with a change in steering operation amount, e.g., the accelerator opening degree or the steering angle, is efficiently extracted. As a result, the notch frequency can be more accurately controlled.

Figure 3:
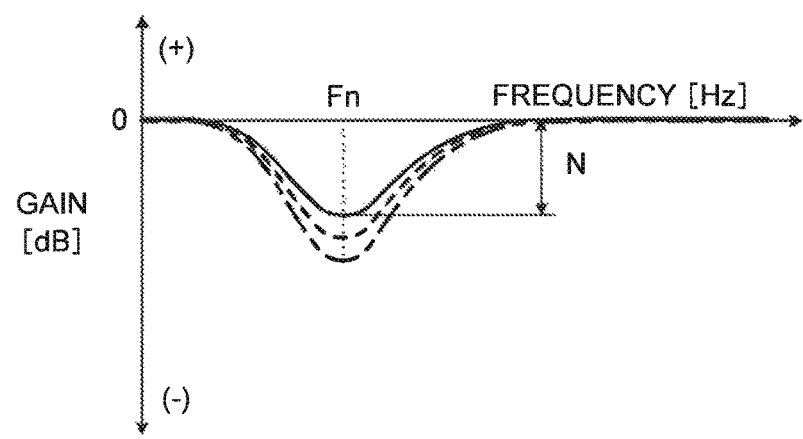
FIG. 3 is a graph for showing a frequency characteristic of a notch filter.

The notch degree calculation unit 34b controls a notch degree of the notch filter 32, namely, an attenuation degree of a component of the notch frequency, to increase/decrease. FIG. 3 is a graph for showing a frequency characteristic of the notch filter 32, in which Fn denotes a notch frequency. As can be understood from FIG. 3, a notch degree N represents a depth of a V-shaped notch in the frequency characteristics. As the notch degree becomes higher, an attenuation degree of a driver required driving force in the notch frequency becomes higher.

As illustrated in FIG. 2, the notch degree calculation unit 34b variably sets the notch degree of the notch filter based on at least one of a parameter of the operation state of the vehicle, which is a travel parameter of the vehicle, or a parameter of the drive operation of the driver with a fluctuation of the driving force. In this case, the parameter of the operation state of the vehicle may be a vehicle speed, an engine rotational speed, and rotational speeds of the motor/generators, and the parameter of the drive operation of the driver with the fluctuation in the driving force of the vehicle may be an accelerator opening degree, the gear shift position, and information on a switch, e.g., a travel mode selection and the like.

The notch degree restriction unit 34c corrects the notch degree N calculated by the notch degree calculation unit 34b depending on necessity so that the notch degree does not deviate from a range between an upper reference and a lower reference.

The calculation of the notch frequency, the calculation of the notch degree, and the restriction on the notch degree in the notch filter control unit 34 do not constitute the gist of the present invention, and are thus not further described.

However, methods described in Japanese Patent Application Laid-open No. 2007-237879, Japanese Patent Application Laid-open No. 2007-237881, and Japanese Patent Application Laid-open No. 2015-105042 applied by the applicant of the present invention may appropriately be applied.

The vehicle driving force control apparatus of this embodiment sets the notch frequency of the notch filter 32 to a value for reducing the vibration frequency component of the vehicle body 2. Therefore, the output signal value of the notch filter 32 is used to control the driving force of the hybrid system, resulting in suppression of the vibration of the vehicle body 2. In this embodiment, the filter characteristic of the notch filter 32 is set so as to decrease the pitching vibration and the rolling vibration, but the filter characteristic may be set so as to reduce at least the pitching vibration.

<Digital Filter>

The notch filter 32 of this embodiment is a digital filter. In general, the digital filter has such a characteristic that the output signal value after the filtering is delayed from the input signal value before the filtering, and does not monotonically follow a change in the input value (that is, pulsates).

Figure 10:
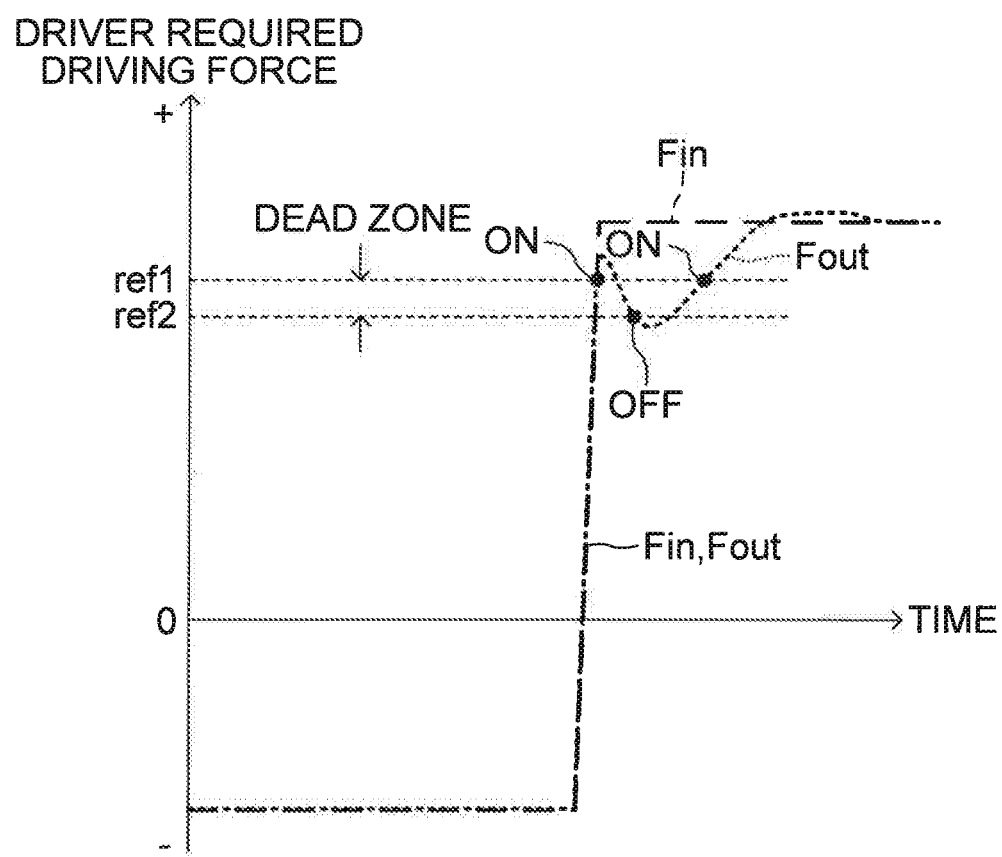
FIG. 10 is a graph for showing a relationship between a driver required driving force before filtering and a driver required driving force after the filtering according to the related art.

Therefore, when a related-art digital filter is used as the notch filter 32 for the vehicle driving force control apparatus, as shown in FIG. 10, a command driving value Fout, which is the driver required driving force value after the filtering, fluctuates to increase/decrease with respect to a driver required driving force value Fin before the filtering. As a result, the command driving value Fout may repeatedly pass across the first threshold value ref1 and the second threshold value ref2, respectively, which determine the start and the stop of the engine 21. In this case, the start and the stop of the engine 21 are repeated, which may cause the driver to feel the sense of discomfort.

Figure 11:
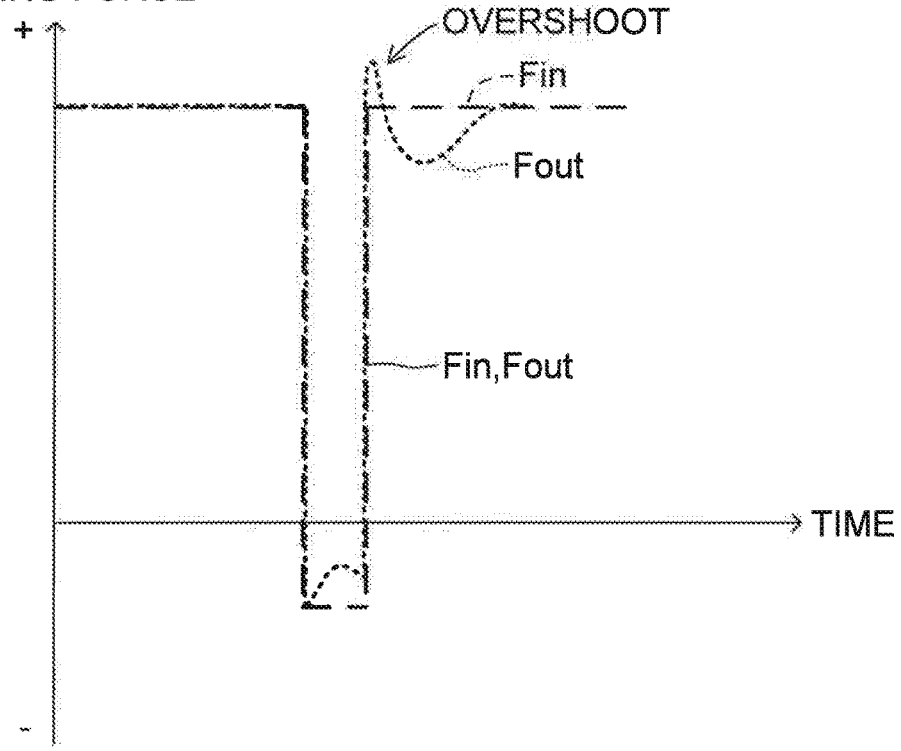
FIG. 11 is a graph for showing a relationship between the driver required driving force before filtering and the driver required driving force after the filtering according to the related art.

Moreover, as shown in FIG. 11, when the driver quickly operates the accelerator pedal, the command driving value Fout may temporarily become more than the driver required driving force value Fin. In other words, the command driving value Fout may exceed a fluctuation range of the driver required driving force value Fin. In this case, there is such a fear that the driver may feel an unintended sense of acceleration.

Thus, in this embodiment, the digital filter provided in the driving force ECU 30 and used as the notch filter 32 is configured to perform filtering so that the value after filtering monotonically approaches the value before the filtering, and does not exceed the current value before the filtering.

Figure 4:
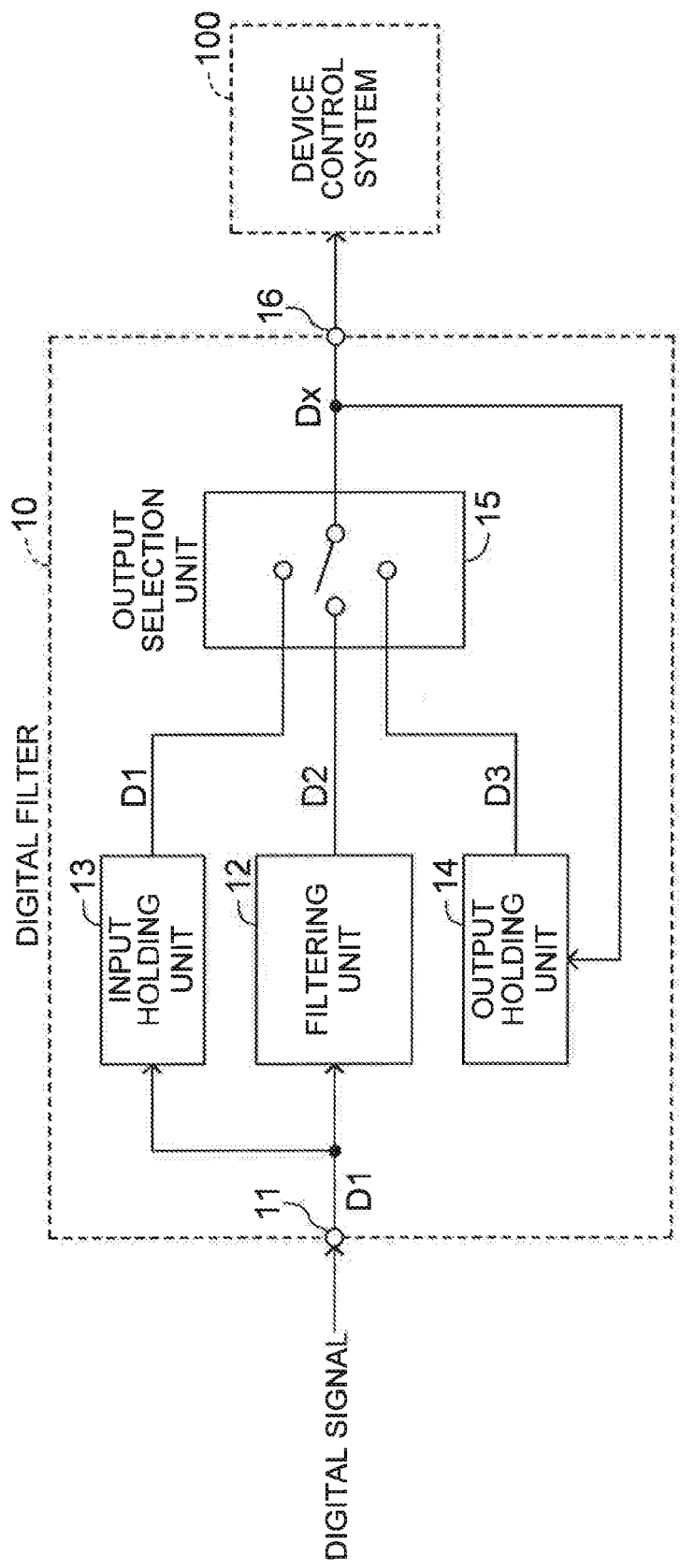
FIG. 4 is a schematic configuration diagram for illustrating a digital filter according to an embodiment of the present invention.

FIG. 4 is a diagram for illustrating a schematic configuration of a digital filter 10 serving as the digital filter according to the embodiment of the present invention. This digital filter 10 is used as the notch filter 32 of the vehicle driving force control apparatus described above, but is not limited to the application to the vehicle driving force control apparatus, and can be generally applied to a system configured to use the output value of the digital filter to control a device. In particular, the digital filter can be appropriately used in a system configured to control an operation of a device depending on a magnitude relationship between the output value of the digital filter and the threshold value. A description is now given of the digital filter 10 configured to input a digital signal representing a required control amount directed to a device, and filter the input digital signal in a general device control system 100.

The digital filter 10 is constructed by a microcomputer, and in terms of functions, includes a signal input unit 11, a filtering unit 12, an input holding unit 13, an output holding unit 14, an output selection unit 15, and a signal output unit 16. The signal input unit 11 is configured to input the digital signal at a predetermined calculation cycle, and supply the input digital signal to the filtering unit 12 and the input holding unit 13. This digital signal is a signal representing the required control amount directed to a device of the device control system 100. For example, when the device control system 100 is the above-mentioned vehicle driving force control apparatus, the digital signal is a signal representing the driver required driving force.

The filtering unit 12 applies filtering (e.g., processing such as band-pass filtering and notch filtering) of reducing (which also means removing) a specific frequency component to the digital signal input to the signal input unit 11. For example, when the device control system 100 is the above-mentioned vehicle driving force control apparatus, the filtering unit 12 applies the filtering to the input digital signal so as to reduce the vibration frequency component of the vehicle body. The filtering unit 12 supplies the digital signal after the filtering to the output selection unit 15. A general digital filter can be used as this filtering unit 12.

The digital signal that is input to the signal input unit 11 and has not been filtered yet by the filtering unit 12 is hereinafter referred to as unfiltered signal. A signal acquired by filtering the unfiltered signal by the filtering unit 12 is hereinafter referred to as filtered signal. Moreover, a value represented by the unfiltered signal is hereinafter referred to as unfiltered value D1. A value represented by the filtered signal is hereinafter referred to as filtered value D2.

The input holding unit 13 is configured to store and hold the unfiltered value D1 of the unfiltered signal input to the signal input unit 11. The input holding unit 13 is configured to store and hold the unfiltered value D1 during a period in which the unfiltered signal is filtered by the filtering unit 12 and is supplied to the output selection unit 15 and the selection of a middle value described later is completed by the output selection unit 15. The input holding unit 13 is configured to store and hold the next unfiltered value D1 of the unfiltered signal input to the signal input unit 11 each time the output selection unit 15 completes the selection of the middle value. In this way, the input holding unit 13 stores and updates the unfiltered value D1.

The output holding unit 14 is configured to store and hold a value represented by the latest output signal output from the signal output unit 16, namely, the latest output signal of the digital filter 10. The value represented by this latest output signal of the digital filter 10 is hereinafter referred to as previous output value D3. The output holding unit 14 is configured to store and update the previous output value D3 each time the output signal is output from the signal output unit 16.

The output selection unit 15 is configured to read, when the filtered signal is supplied from the filtering unit 12, the unfiltered value D1 stored in the input holding unit 13 and the previous output value D3 stored in the output holding unit 14. The output selection unit 15 acquires the unfiltered value D1, the filtered value D2, and the previous output value D3 in this way. The output selection unit 15 selects a middle value out of the acquired three values D1, D2, and D3, and sets the selected value as a current output value Dx. The output selection unit 15 supplies the set current output value Dx to the signal output unit 16. The signal output unit 16 is configured to output to the device control system 100 an output signal representing the output value Dx supplied from the output selection unit 15. This output signal is the output signal of the digital filter 10. For example, when the device control system 100 is the above-mentioned vehicle driving force control apparatus, the output signal is a signal representing the command driving force.

In this device control system 100, the output signal of the digital filter 10 is input, and the operation of the device is controlled in response to the output value Dx of the output signal. In this case, the device includes a component whose operation is controlled at least based on a magnitude relationship between the output value Dx and threshold values. For example, in the device control system, the device is started when the output value Dx becomes more than a first threshold value Dref1, and the device is stopped when the output value Dx becomes less than a second threshold value Dref2. In this case, a dead zone is provided between the first threshold value Dref1 and the second threshold value Dref2 by setting the second threshold value Dref2 to be a value smaller than the first threshold value Dref1.

A description is now given of an example of the value selected by the output selection unit 15. For example, in a case in which D1=10, D2=20, and D3=5, a relationship D3<D1<D2 is satisfied, and the output selection unit 15 selects D1 (=10) as the middle value of D1, D2, and D3. Thus, the value 10 (Dx=10) is set as the current output value Dx.

Moreover, for example, in a case in which D1=10, D2=10, and D3=5 and two values are thus equal to each other, the output selection unit 15 selects the values D1=D2=(10), which are the same values, as the middle values of D1, D2, and D3. In this case, relationships D3<D1=D2 and D3<D2=D1 are satisfied, and it is thus considered that the selection of D1 or D2 is more appropriate than the selection of D3 as the middle value. Further, in a case in which all the three values D1, D2, and D3 are equal to one another (D1=D2=D3), the output selection unit 15 selects any one of D1, D2, and D3 as the middle value.

In the digital filter 10 of this embodiment, the CPU of the microcomputer executes instructions (programs) stored in the ROM to implement the functions of the filtering unit 12, the input holding unit 13, the output holding unit 14, and the output selection unit 15, and the respective units 12, 13, 14, and 15 synchronously carry out the above-mentioned pieces of processing at a predetermined calculation cycle, thereby finally converting the digital signal input to the signal input unit 11 into the output signal representing the output value Dx.

Even when the filtered value D2 greatly pulsates with respect to the unfiltered value D1, the digital filter 10 of this embodiment selects the middle value out of the unfiltered value D1, the filtered value D2, and the previous processing value D3, and sets the selected middle value as the current output value Dx of the output signal. Thus, the output value Dx can be caused to monotonically approach the unfiltered value D1. Moreover, the absolute value of the output value Dx does not become more than the absolute value of the unfiltered value D1.

For example, when the filtered value D2 is departing from the unfiltered value D1, the previous output value D3 is selected as the middle value after a time point of the departure. Thus, the previous output value D3 is set as the output value Dx. Then, while the magnitude relationship among the unfiltered value D1, the previous output value D3, and the filtered value D2 remains the same, the output value Dx is maintained to be the previous output value D3, and is thus a constant value. Thus, the output value Dx is reliably guarded so as not to depart from the unfiltered value D1.

When, for example, the filtered value D2 changes toward a direction of approaching the unfiltered value D1 under this state, and the magnitude relationship between the filtered value D2 and the previous output value D3 is inverted, the filtered value D2 is selected as the middle value. Thus, the output value Dx follows the filtered value D2, and approaches the unfiltered value D1. Conversely, when the unfiltered value D1 changes, and the magnitude relationship between the unfiltered value D1 and the previous output value D3 is inverted, the unfiltered value D1 is selected as the middle value. Thus, the output value Dx follows the unfiltered value D1.

Therefore, the output value Dx can be caused to monotonically approach the unfiltered value D1. Moreover, even when the threshold values in the device control system are not recognized, the output value Dx can be prevented from passing across the threshold values undesirably. Further, the absolute value of the filtered value D2 does not become more than the absolute value of the unfiltered value D1, and the fluctuation range of the output value Dx can be prevented from becoming more than the fluctuation range of the unfiltered value D1. The undesirable passage of the output value Dx across the threshold value represents a passage of the output value Dx across the threshold value under a state in which the unfiltered value D1 has not passed across the threshold value.

As a result, with the digital filter 10 according to this embodiment, a device can stably be controlled. Moreover, the appropriate filtering can be carried out through the simple processing of selecting the middle value without changing the characteristic of the filtering unit 12. In other words, the appropriate filtering can be carried out only by adding the functional unit configured to select the middle value to a general filter, which does not lead to a great increase in the cost.

Figure 5:
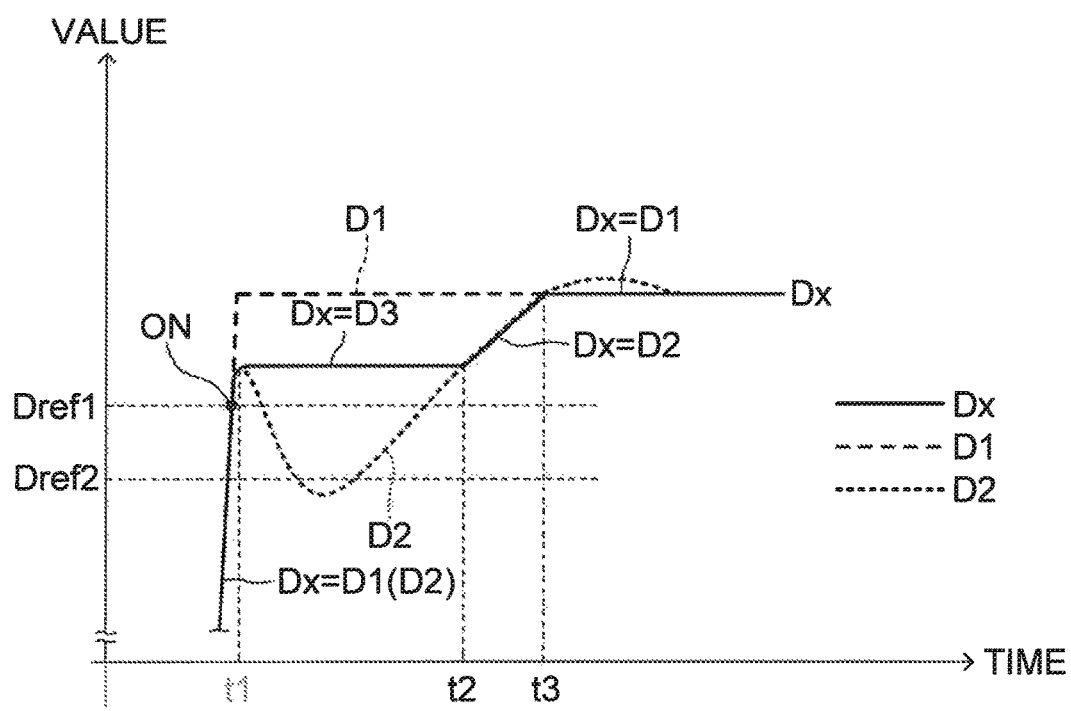
FIG. 5 is a graph for showing transitions of input/output values of the digital filter.

Referring to FIG. 5, a description is now given of a transition of the output value Dx when the digital filter 10 of this embodiment is applied to the notch filter 32 of the vehicle driving force control apparatus. On this occasion, a description is given while using waveforms of the driver required driving force value Fin and the driver required driving force value Fout in the related-art vehicle driving force control apparatus shown in FIG. 10. In this case, the driver required driving force value Fin is represented by the unfiltered value D1, and the driver required driving force value Fout is represented by the filtered value D2. The signal value finally output by the digital filter 10 to the driving force control unit 33 is the output value Dx (solid line).

When the accelerator pedal is suddenly depressed under a state in which the accelerator pedal is released (regenerative braking state by the motor/generators), the unfiltered value D1 rapidly increases. On this occasion, the filtered value D2 also follows the unfiltered value D1 to increase. Then, the unfiltered value D1 is stabilized at a predetermined value exceeding the first threshold value Dref1. The filtered value D2 also exceeds the first threshold value similarly to the unfiltered value D1, but transitions toward the decrease direction in the course of the increase due to the influence of the filtering by the filtering unit 12.

The output value Dx is set to the same value as the filtered value D2 (=D1) while the filtered value D2 follows the unfiltered value D1 to increase. Then, when the filtered value D2 decreases with respect to the unfiltered value D1, after this time point t1, the output value Dx is set to the previous output value D3.

This output value Dx is maintained to be the previous output value D3 while the magnitude relationship between the filtered value D2 and the previous output value D3 is not inverted, that is, the filtered value D2 is not more than the previous output value D3. Thus, the output value Dx is maintained to be a constant value, and reliably guarded so as not to depart from the unfiltered value D1.

When the filtered value D2 turns to increase, and becomes more than the previous output value D3, from this time point t2, the filtered value D2 is selected as the middle value. Thus, the filtered value D2 is set as the output value Dx. Therefore, the output value Dx follows the filtered value D2, and approaches the unfiltered value D1. Then, when the filtered value D2 reaches the unfiltered value D1, and then becomes more than the unfiltered value D1, from a time point t3 at which the unfiltered value D1 is reached, the unfiltered value D1 is selected as the middle value. Thus, from the time point t3, the output value Dx follows the unfiltered value D1. Therefore, the output value Dx does not become more than the unfiltered value D1.

Thus, the command driving value can be caused to monotonically (without pulsation) approach the required driving force before the filtering by applying the digital filter 10 of this embodiment to the notch filter 32 of the vehicle driving force control apparatus. Therefore, the command driving value can be prevented from passing across the dead zone undesirably. Thus, the start/stop of the engine can be stably carried out. As a result, the driver can be prevented from feeling the sense of discomfort. Moreover, the absolute value of the command driving value can be prevented from exceeding the absolute value of the required driving force. As a result, the driver can be prevented from feeling an unintended sense of acceleration and an unintended sense of deceleration.

Digital Filter of Modified Example

Figure 6:
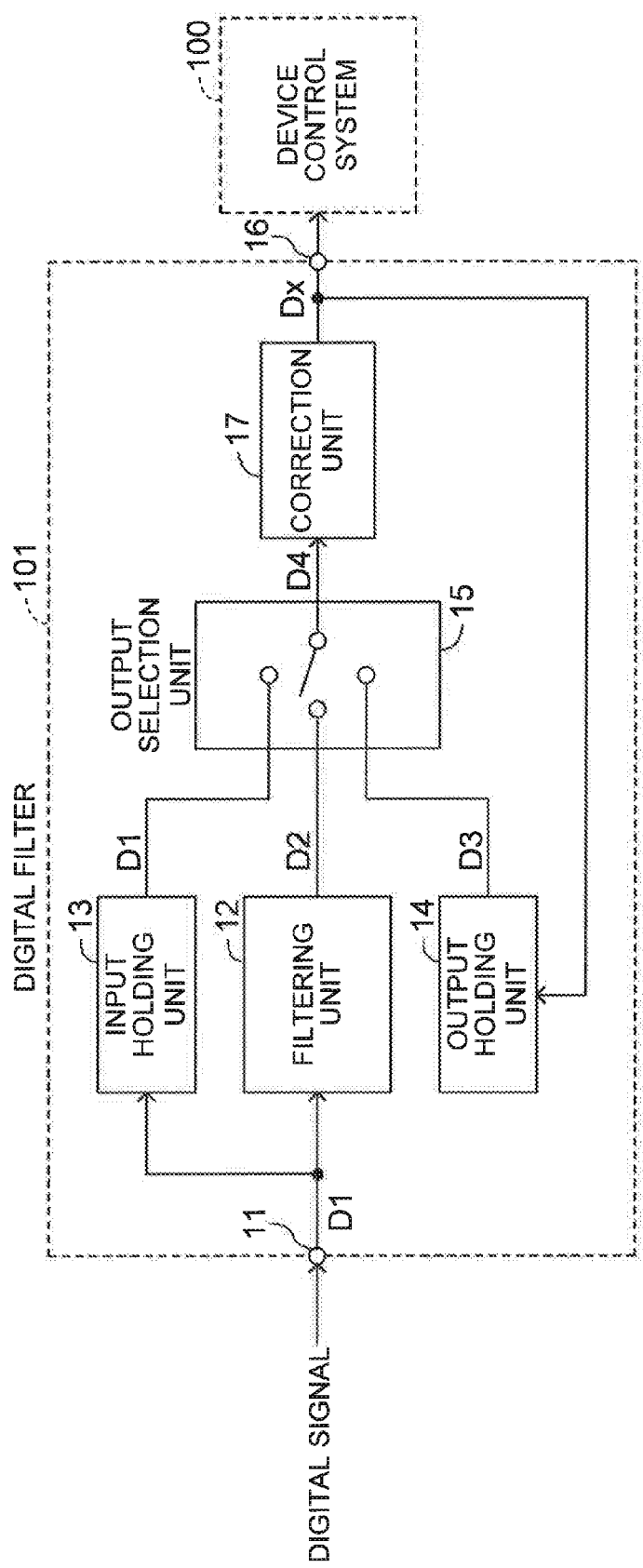
FIG. 6 is a schematic configuration diagram for illustrating a digital filter of a modified example of the present invention.

In the digital filter 10 of the above-mentioned embodiment, while the previous output value D3 is the middle value, the output value Dx is maintained to be a constant value. Thus, the output value Dx is very stable, and is thus advantageous for stability of the device. On the other hand, when the transition of the output value Dx needs to approach the original operation of the filtering, the digital filter of a modified example of the present invention is effective. This modified example has a function of correcting the middle value so that the output value Dx approaches the original operation of the filtering, and setting the corrected value as the output value Dx. FIG. 6 is a diagram for illustrating a schematic configuration of a digital filter 101 as a modified example.

The digital filter 101 of this modified example has such a configuration that a correction unit 17 is added to the digital filter 10 of the embodiment, and the other configurations are common with the digital filter 10 of the embodiment. Thus, the common configurations are denoted by common reference numerals in the figure, and a description thereof is therefore omitted.

The digital filter 101 includes the correction unit 17 between the output selection unit 15 and the signal output unit 16. The correction unit 17 is configured to input the middle value (hereinafter referred to as middle value D4) output from the output selection unit 15, correct the middle value D4, and set the corrected value as the output value Dx. This output value Dx is supplied to the signal output unit 16 and the output holding unit 14 as in the embodiment. Moreover, the correction unit 17 stores the threshold values (first threshold value Dref1 and second threshold value Dref2) used for the control of the device in the device control system 100.

Figure 7:
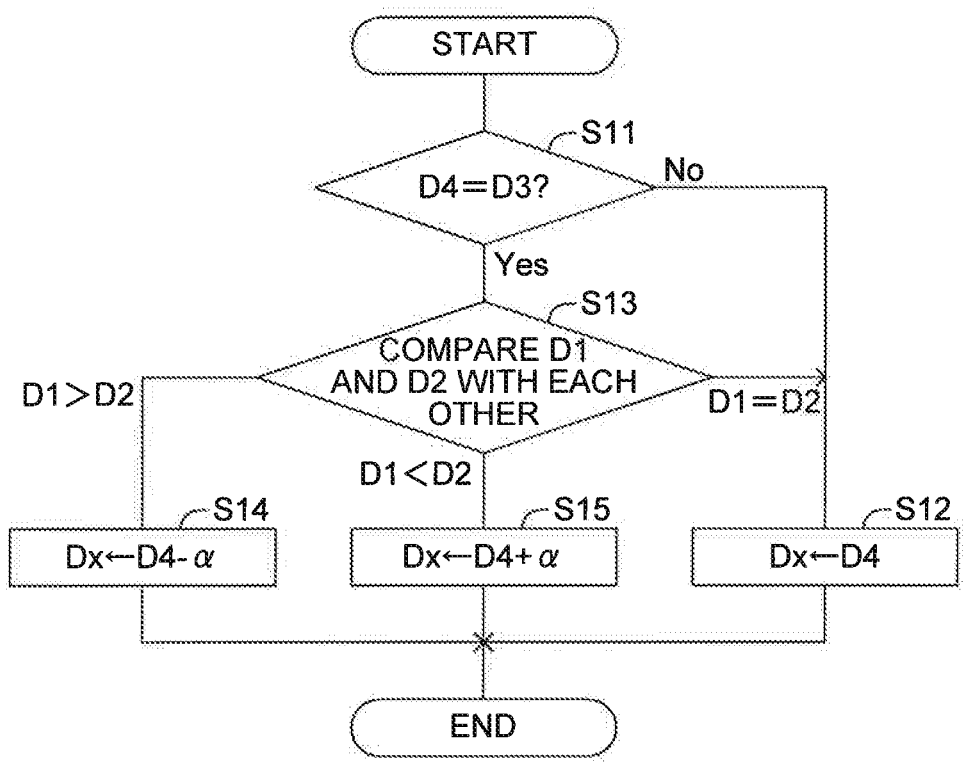
FIG. 7 is a flowchart for illustrating a correction routine.

FIG. 7 is a flowchart for illustrating a correction routine executed by the correction unit 17. The correction routine is repeatedly executed at a predetermined calculation cycle. When the correction routine is invoked, in Step S11, the correction unit 17 determines whether the previous output value D3 and the middle value D4 are equal to each other, that is, whether the previous output value D3 is selected as the middle value D4. When the previous output value D3 and the middle value D4 are not equal to each other, in Step S12, the correction unit 17 sets the middle value D4 as the output value Dx.

On the other hand, when the previous output value D3 and the middle value D4 are equal to each other, in Step S13, the correction unit 17 compares the unfiltered value D1 and the filtered value D2 with each other. When the unfiltered value D1 is more than the filtered value D2, in Step S14, the correction unit 17 calculates a value (D4−α) acquired by correction of reducing the middle value D4 by a unit correction amount α, and sets the calculated value (D4−α) as the output value Dx. Moreover, when the unfiltered value D1 is less than the filtered value D2, in Step S15, the correction unit 17 calculates a value (D4+α) acquired by correction of increasing the middle value D4 by the unit correction amount α, and sets the calculated value (D4+α) as the output value Dx. Further, when the unfiltered value D1 and the filtered value D2 are equal to each other, the correction unit 17 advances the processing to Step S12, and sets the middle value D4 as the output value Dx.

When the correction unit 17 sets the output value Dx, the correction unit 17 ends the correction routine tentatively. The correction unit 17 repeatedly carries out the correction routine at the calculation cycle synchronized with the other functional units 12, 13, 14, and 15. It should be noted that, in parallel with the execution of the correction routine, the correction unit 17 compares the output value Dx and the threshold values with each other, and uses the above-mentioned correction routine to carry out the correction restricted to a range in which the output value Dx does not pass across the threshold values. For example, when the output value Dx is more than the first threshold value Dref1, the correction unit 17 uses the correction routine to carry out the correction restricted to a range in which the output value Dx is not less than the second threshold value Dref2. Moreover, when the output value Dx is not more than the first threshold value Dref1, the correction unit 17 uses the correction routine to carry out the correction restricted to a range in which the output value Dx is not more than the first threshold value Dref1.

Figure 8:
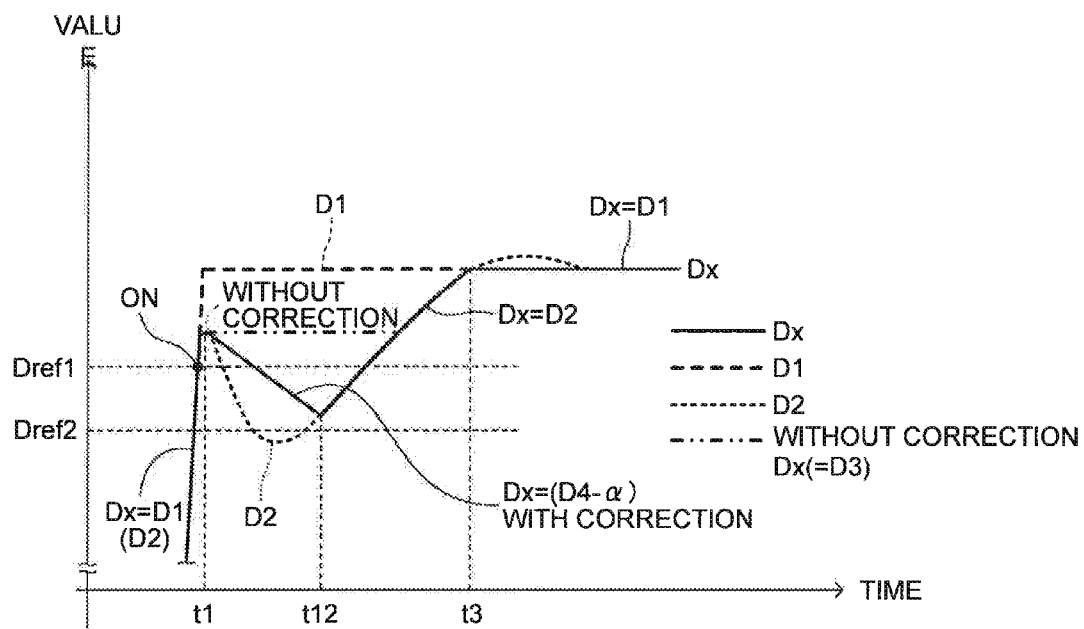
FIG. 8 is a graph for showing transitions of input/output values of the digital filter of the modified example.

FIG. 8 is a graph for showing a comparison to the graph (FIG. 5) of the embodiment, and the output value Dx output from the correction unit 17 is represented by the solid line. Moreover, the output value Dx (without the correction) of the embodiment is represented by a two-dot chain line as a comparative example. In this modified example, from the time point t1, the previous output value D3 is selected by the output selection unit 15 (D3=D4), and the value (D4−α), which is acquired by correcting the middle value D4, is set as the output value Dx. Thus, the output value Dx decreases at a gradient corresponding to the unit correction amount α. Then, at a time point t12, when the filtered value D2 becomes more than the output value Dx, the filtered value D2 is set to the middle value D4. Thus, from the time point t12, the filtered value D2 is set as the output value Dx. A transition of the output value Dx after the time point t12 is the same as the transition (FIG. 5) of the embodiment.

As can be understood from this graph, the output value Dx can be caused to approach the original operation of the filtering by the digital filter 101. Moreover, this configuration can be implemented by adding the simple processing. Further, a degree of freedom for designing the filter increases.

It should be noted that, for example, the correction unit 17 may variably change the magnitude of the unit correction amount α depending on a magnitude |ΔD| of a deviation ΔD between the output value Dx and the threshold value. In this case, the magnitude of the unit correction amount α may decrease as |ΔD| decreases.

Moreover, in this modified example, the correction unit 17 is configured to carry out both the increase correction and the decrease correction, but the correction unit 17 may be configured to carry out only the increase correction or the decrease correction. When only the increase correction is carried out, in place of Step S14, Step S12 may be carried out. When only the decrease correction is carried out, in place of Step S15, Step S12 may be carried out.

Second Embodiment

Figure 9:
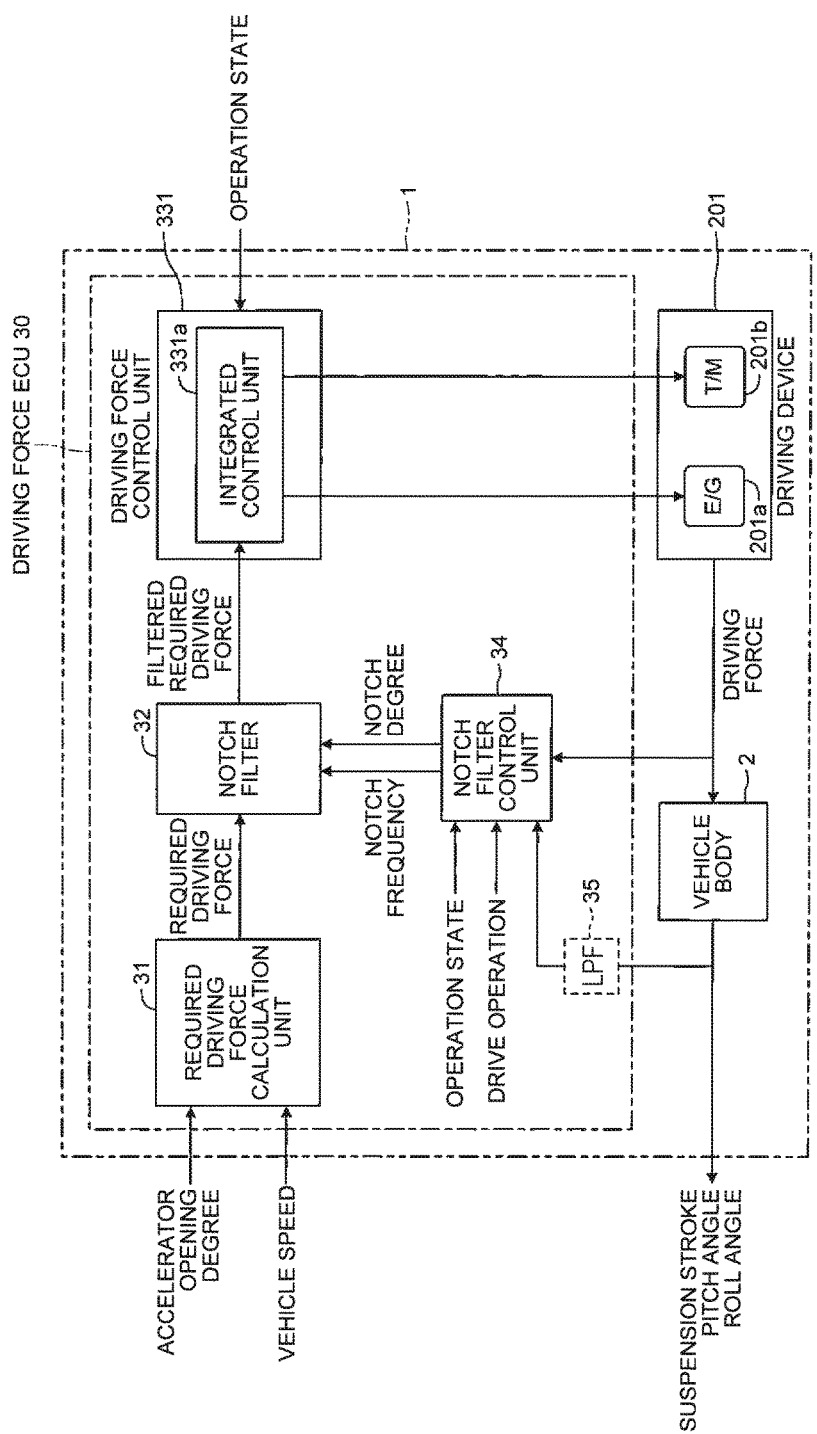
FIG. 9 is a schematic configuration diagram for illustrating a vehicle driving force control apparatus according to a second embodiment of the present invention.

The vehicle driving force control apparatus of the above-mentioned embodiment (hereinafter referred to as first embodiment) is applied to the hybrid vehicle, but can also be applied to a vehicle including an engine and an automatic transmission as a driving device. FIG. 9 is a schematic configuration diagram for illustrating a vehicle driving force control apparatus according to a second embodiment of the present invention.

The vehicle driving force control apparatus according to the second embodiment includes a driving force control unit 331 in place of the driving force control unit 33 of the first embodiment, and a driving device 201 in place of the driving device 20, and the other configurations are the same as those of the first embodiment. The same configurations as those of the first embodiment are denoted by the same reference numerals in the figure, and a description thereof is therefore omitted.

The driving force control unit 331 includes an engine/transmission integrated control unit 331a (hereinafter referred to as integrated control unit 331a). The driving device 201 includes an engine 201a and an automatic transmission 201b. The integrated control unit 331a is configured to determine an engine required torque and a gear position for achieving the command driving force (filtered required driving force) supplied from the notch filter 32 based on the command driving force. The integrated control unit 331a carries out driving force control (fuel injection control, ignition control, and intake air amount control) for the engine 201a based on the engine required torque. Moreover, the integrated control unit 331a shifts the gear position of the automatic transmission 201b based on the determined gear position.

The integrated control unit 331a is configured to store threshold values (threshold values between which a dead zone is set, for example, a gear shift line of a widely-known gear shift schedule) for shifting the gear position, and detect a passage of the command driving force through the threshold value to shift the gear position. In this case, the command driving force and the threshold value may be directly compared with each other, or a value calculated based on the command driving force and the threshold value may be compared with each other. Moreover, the threshold value may be variably set based on parameters representing the operation state, e.g., the vehicle speed.

In such a configuration that the gear position of the automatic transmission 201b is shifted based on the command driving force, when the command driving force pulsates, the shift of the gear position may be undesirably repeated. Thus, also in the second embodiment, the digital filter 10 (or 101) may be used as the notch filter 32.

Thus, the vehicle driving force control apparatus according to the second embodiment can suppress the vibration of the vehicle body 2, and can stably shift the gear position.

A description has been given of the digital filters and the vehicle driving force control apparatus including the digital filters according to the embodiments and the modified example, but the present invention is not limited to the embodiments and the modified example, and can be modified in various ways without departing from an object of the present invention.

For example, the application of the digital filter is not limited to the vehicle driving force control apparatus, and can be applied to various device control systems.

What is claimed is:

1. A digital filter, which is configured to output an output signal acquired by reducing a specific frequency component from a digital signal input to the digital filter, and which is to be used for a system in which an operation of a device is controlled depending on an output value of the output signal, the digital filter comprising:
    filtering means for applying filtering to the digital signal input; and
    output value setting means for acquiring an unfiltered value represented by the digital signal input, a filtered value represented by a signal acquired by filtering the digital signal input by the filtering means, and a previous output value represented by a previously output signal output at a previous time as a current output value, selecting a middle value of the unfiltered value, the filtered value, and the previous output value, and setting the current output value of a current output signal based on the selected middle value.

2. The digital filter according to claim 1, wherein the output value setting means is configured to set the selected middle value as the current output value of the current output signal.

3. A vehicle driving force control apparatus comprising the digital filter according to claim 2, wherein the vehicle driving force control apparatus comprises:
    required driving force calculation means for calculating a driver required driving force, and outputting a required driving force signal representing the calculated driver required driving force;
    a notch filter constructed by the digital filter, and configured to input the required driving force signal, and to use the filtering means to apply the filtering to the required driving force signal so as to reduce a vibration frequency component of a vehicle body; and
    driving force control means for controlling a driving force to be generated in a vehicle travel driving device based on an output value of an output signal of the notch filter.

4. The vehicle driving force control apparatus according to claim 3, wherein:
    the vehicle travel driving device comprises a hybrid driving device comprising an engine and a motor/generator; and
    the driving force control means is configured to control the driving force of the hybrid driving device depending on the output value of the output signal of the notch filter, and to switch between a driving state and a non-driving state of the engine.

5. The vehicle driving force control apparatus according to claim 3, wherein:

the vehicle travel driving device comprises a driving device comprising an engine and an automatic transmission; and the driving force control means is configured to control the driving force of the engine and shift a gear position of the automatic transmission depending on the output value of the output signal of the notch filter.

6. The digital filter according to claim 1, wherein the output value setting means is configured to:

carry out, when the selected middle value is the previous output value, at least one of increase correction processing of increasing the selected middle value by a predetermined amount for correction and setting the increased selected middle value as the current output value when the filtered value is more than the unfiltered value, or decrease correction processing of decreasing the selected middle value by a predetermined amount for correction and setting the decreased selected middle value as the current output value when the filtered value is less than the unfiltered value; and set the selected middle value as the current output value of the current output signal when the selected middle value is not the previous output value.

7. A vehicle driving force control apparatus comprising the digital filter according to claim 6, wherein the vehicle driving force control apparatus comprises:

required driving force calculation means for calculating a driver required driving force, and outputting a required driving force signal representing the calculated driver required driving force;

a notch filter constructed by the digital filter, and configured to input the required driving force signal, and to use the filtering means to apply the filtering to the required driving force signal so as to reduce a vibration frequency component of a vehicle body; and driving force control means for controlling a driving force to be generated in a vehicle travel driving device based on an output value of an output signal of the notch filter.

8. The vehicle driving force control apparatus according to claim 7, wherein:

the vehicle travel driving device comprises a hybrid driving device comprising an engine and a motor/generator; and the driving force control means is configured to control the driving force of the hybrid driving device depending on the output value of the output signal of the notch filter, and to switch between a driving state and a non-driving state of the engine.

9. The vehicle driving force control apparatus according to claim 7, wherein:

the vehicle travel driving device comprises a driving device comprising an engine and an automatic transmission; and the driving force control means is configured to control the driving force of the engine and shift a gear position of the automatic transmission depending on the output value of the output signal of the notch filter.

10. A vehicle driving force control apparatus comprising the digital filter according to claim 1, wherein the vehicle driving force control apparatus comprises:

required driving force calculation means for calculating a driver required driving force, and outputting a required driving force signal representing the calculated drive required driving force;

a notch filter constructed by the digital filter, and configured to input the required driving force signal, and to use the filtering means to apply the filtering to the required driving force signal so as to reduce a vibration frequency component of a vehicle body; and driving force control means for controlling a driving force to be generated in a vehicle travel driving device based on an output value of an output signal of the notch filter.

11. The vehicle driving force control apparatus according to claim 10, wherein:

the vehicle travel driving device comprises a hybrid driving device comprising an engine and a motor/generator; and the driving force control means is configured to control the driving force of the hybrid driving device depending on the output value of the output signal of the notch filter, and to switch between a driving state and a non-driving state of the engine.

12. The vehicle driving force control apparatus according to claim 10, wherein:

the vehicle travel driving device comprises a driving device comprising an engine and an automatic transmission; and the driving force control means is configured to control the driving force of the engine and shift a gear position of the automatic transmission depending on the output value of the output signal of the notch filter.

* * * * *